(12) United States Patent
Won et al.

(10) Patent No.: US 10,851,298 B2
(45) Date of Patent: Dec. 1, 2020

(54) ELECTRONIC DEVICE INCLUDING QUANTUM DOTS

(71) Applicant: SAMSUNG ELECTRONICS CO., LTD., Suwon-si (KR)

(72) Inventors: Yuho Won, Seoul (KR); Ha Il Kwon, Suwon-si (KR); Eun Joo Jang, Suwon-si (KR); Jaejun Chang, Gwacheon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/554,839

(22) Filed: Aug. 29, 2019

(65) Prior Publication Data
US 2020/0071612 A1 Mar. 5, 2020

(30) Foreign Application Priority Data
Aug. 30, 2018 (KR) .................. 10-2018-0102972

(51) Int. Cl.
*C09K 11/88* (2006.01)
*C09K 11/08* (2006.01)
(Continued)

(52) U.S. Cl.
CPC ........ *C09K 11/883* (2013.01); *C09K 11/0883* (2013.01); *H01L 51/502* (2013.01);
(Continued)

(58) Field of Classification Search
None
See application file for complete search history.

(56) References Cited

U.S. PATENT DOCUMENTS 7,318,957 B2  1/2008  Sato et al.
7,700,200 B2  4/2010  Bulovic et al.
(Continued)

FOREIGN PATENT DOCUMENTS

CN    106479482 A    3/2017
EP    2867156 A1     5/2015
(Continued)

OTHER PUBLICATIONS

Christian Ippen et al., "Color tuning of indium phosphide quantum dots for cadmium-free quantum dot lightemitting devices with high efficiency and color saturation," Journal of the Society for Information Display, 2015, pp. 285-293, vol. 23, Issue 7.
(Continued)

*Primary Examiner* — Thien F Tran
(74) *Attorney, Agent, or Firm* — Cantor Colburn LLP

(57) ABSTRACT

An electroluminescent device includes a first electrode and a second electrode facing each other, and an emissive layer disposed between the first electrode and the second electrode and including the quantum dots. The quantum dots include a semiconductor nanocrystal core including indium (In) and phosphorous (P), a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur, wherein the quantum dots do not include cadmium. The electroluminescent device has an external quantum efficiency of greater than or equal to about 9% and a maximum brightness of greater than or equal to about 10,000 candelas per square meter ($cd/m^2$).

22 Claims, 6 Drawing Sheets

(51) Int. Cl.
  *H01L 51/50* (2006.01)
  *B82Y 20/00* (2011.01)
  *H01L 51/00* (2006.01)
  *B82Y 40/00* (2011.01)

(52) U.S. Cl.
  CPC ............... *B82Y 20/00* (2013.01); *B82Y 40/00* (2013.01); *H01L 51/0035* (2013.01); *H01L 51/0037* (2013.01); *H01L 51/0039* (2013.01); *H01L 51/0043* (2013.01)

(56) References Cited

U.S. PATENT DOCUMENTS

| | | |
|---|---|---|
| 8,232,722 B2 | 7/2012 | Bawendi et al. |
| 8,330,142 B2 | 12/2012 | Cho et al. |
| 2005/0274944 A1 | 12/2005 | Jang et al. |
| 2008/0290797 A1 | 11/2008 | Park et al. |
| 2009/0039764 A1 | 2/2009 | Cho et al. |
| 2010/0108984 A1 | 5/2010 | Cho et al. |
| 2010/0109521 A1 | 5/2010 | Yang et al. |
| 2011/0262752 A1 | 10/2011 | Bawendi et al. |
| 2012/0032138 A1 | 2/2012 | Kim et al. |
| 2013/0115455 A1 | 5/2013 | Banin et al. |
| 2014/0014896 A1 | 1/2014 | Chung et al. |
| 2015/0228850 A1 | 8/2015 | Zheng et al. |
| 2016/0035983 A1 | 2/2016 | Kathirgamanathan |
| 2016/0298029 A1 | 10/2016 | Vogel |
| 2017/0306227 A1 | 10/2017 | Ippen et al. |
| 2018/0201834 A1 | 7/2018 | Banin et al. |
| 2018/0239245 A1* | 8/2018 | Yang ............... C09K 11/703 |
| 2019/0211260 A1* | 7/2019 | Won ............... C09K 11/025 |
| 2019/0330525 A1* | 10/2019 | Hens ............... C09K 11/70 |
| 2019/0348623 A1* | 11/2019 | Dohner ............... C09K 11/70 |

FOREIGN PATENT DOCUMENTS

| | | |
|---|---|---|
| EP | 3511394 A1 | 7/2019 |
| KR | 20100095875 A | 9/2010 |
| KR | 20110093391 A | 8/2011 |
| KR | 20130047943 A | 5/2013 |
| KR | 20160142187 A | 12/2016 |
| KR | 1794082 B1 | 11/2017 |
| WO | 2012035535 A1 | 3/2012 |
| WO | 2015002565 A1 | 1/2015 |
| WO | 2015036762 A1 | 3/2015 |
| WO | 2015094646 A1 | 6/2015 |
| WO | 2016114598 A1 | 7/2016 |

OTHER PUBLICATIONS

Ikjun Cho et al., "Multifunctional Dendrimer Ligands for High-Efficiency, Solution-Processed Quantum Dot Light-Emitting Diodes," ACS Nano, Dec. 14, 2016, pp. 684-692, vol. 11.

Kemar R. Reid et al., "Chemical Structure, Ensemble and Single-Particle Spectroscopy of Thick-Shell InP-ZnSe Quantum Dots," Nano Letters, Dec. 28, 2017, pp. 709-716, vol. 18.

Rafael Paez-Lopez et al., "Optical manipulation using optimal annular vortices," Optics Letters, Sep. 1, 2016, pp. 4138-4141, vol. 41, Issue 17.

Vigneshwaran Chandrasekaran et al., "Nearly Blinking-Free, High-Purity Single-Photon Emission by Colloidal InP/ZnSe Quantum Dots," Nano Letters, Sep. 12, 2017, pp. 6104-6109, vol. 17.

Yohan Kim et al., "Increased shell thickness in indium phosphide multishell quantum dots leading to efficiency and stability enhancement in light-emitting diodes," Optical Materials Express, Jun. 26, 2014, pp. 1436-1443, vol. 4, Issue 7.

Extended European Search Report dated Dec. 18, 2019, of the corresponding European Patent Application No. 19194390.1.

* cited by examiner

ELECTRONIC DEVICE INCLUDING QUANTUM DOTS

CROSS-REFERENCE TO RELATED APPLICATION

This application claims priority to and the benefit of Korean Patent Application No. 10-2018-0102972 filed in the Korean Intellectual Property Office on Aug. 30, 2018, and all the benefits accruing therefrom under 35 U.S.C. § 119, the content of which in its entirety is herein incorporated by reference.

BACKGROUND

1. Field

Quantum dots and electronic devices (electroluminescent devices) including the same are disclosed.

2. Description of the Related Art

Quantum dots (e.g., nano-sized semiconductor nanocrystals) having different energy bandgaps may be obtained by controlling the sizes and compositions of the quantum dots. In a colloidal synthesis, organic materials such as a dispersing agent may coordinate, e.g., be bound, to a surface of the semiconductor nanocrystal during the crystal growth thereof, thereby providing a quantum dot having a controlled size and showing, e.g., exhibiting, luminescent properties. The luminescent properties of quantum dots may be used in various fields. For example, the quantum dots may be used in an electroluminescent device, a photoluminescent device, or the like. Developing environmentally friendly quantum dots that may show, e.g., exhibit, enhanced luminous properties without a toxic heavy metal (e.g., cadmium, mercury, lead, or a combination thereof) is desired.

SUMMARY

An embodiment provides an electroluminescent device including quantum dots having improved photoluminescence properties and enhanced stability.

An embodiment provides the quantum dots.

An embodiment provides a method of producing the quantum dots.

An embodiment provides a composition including the quantum dots.

According to an embodiment, an electroluminescent device includes, a first electrode and a second electrode facing each other, and an emissive layer disposed between the first electrode and the second electrode, the emissive layer including quantum dots, wherein the quantum dots include a semiconductor nanocrystal core including indium (In) and phosphorus (P), a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur, wherein the quantum dots do not include cadmium, wherein the electroluminescent device has an external quantum efficiency of greater than or equal to about 9% and a maximum brightness of greater than or equal to about 10,000 candelas per square meter ($cd/m^2$).

The quantum dots may have a maximum photoluminescent peak in a red light wavelength region.

A wavelength of the maximum photoluminescent peak of the quantum dots may be greater than or equal to about 600 nanometers (nm) and less than or equal to about 650 nm.

A difference between a maximum photoluminescent peak wavelength and a first absorption peak wavelength of the quantum dots may be less than or equal to about 20 nm.

The quantum dots may have an average particle size of greater than or equal to about 8 nm.

The quantum dots may have an average particle size of greater than or equal to about 8.5 nm.

The quantum dots may have an average particle size of greater than about 9 nm.

The quantum dots may have an average particle size of greater than about 10 nm.

A quantum yield of the quantum dots may be greater than or equal to about 60%.

A standard deviation of a particle size distribution of the quantum dots may be less than or equal to about 20% of an average size thereof.

A standard deviation of a particle size distribution of the quantum dots may be less than or equal to about 15% of an average size thereof.

In the quantum dots, a molar ratio of indium to a sum of sulfur and selenium (i.e., In:(Se+S), hereinafter which may be recited as the value of In:(Se+S)) may be less than or equal to about 0.1:1.

In the quantum dots, a molar ratio of indium to a sum of sulfur and selenium may be less than or equal to about 0.05:1.

In the quantum dots, a molar ratio of indium to a sum of sulfur and selenium may be greater than or equal to about 0.02:1.

In the quantum dots, a molar ratio of sulfur to selenium (S:Se) may be less than or equal to about 4.5:1.

In the quantum dots, a molar ratio of sulfur to selenium may be greater than or equal to about 0.01:1.

In the quantum dots, a molar ratio of sulfur to selenium may be greater than or equal to about 0.11:1.

In the quantum dots, a molar ratio of zinc to indium may be greater than or equal to about 10:1.

In the quantum dots, a molar ratio of zinc to indium may be greater than or equal to about 15:1.

In the quantum dots, a molar ratio of zinc to indium may be less than about 52:1. In the quantum dots, a molar ratio of zinc to indium may be less than or equal to about 49:1.

The first semiconductor nanocrystal shell may be disposed directly on a surface of the semiconductor nanocrystal core.

The first semiconductor nanocrystal shell may not include sulfur.

A thickness of the first semiconductor nanocrystal shell may be greater than or equal to about 5 monolayers.

A thickness of the first semiconductor nanocrystal shell may be greater than or equal to about 6 monolayers.

A thickness of the first semiconductor nanocrystal shell may be less than or equal to about 15 monolayers.

The second semiconductor nanocrystal shell may be an outermost layer of the quantum dot.

The second semiconductor nanocrystal shell may be disposed directly on a surface of the first semiconductor nanocrystal shell.

The difference between the maximum photoluminescent peak wavelength and the first absorption peak wavelength of the quantum dots may be less than or equal to about 20 nm (or less than or equal to about 17 nm or less than or equal to about 16 nm).

The electroluminescent device may include an electron transport layer between the second electrode and the emissive layer.

The electron transport layer may include a metal oxide comprising zinc.

The metal oxide may be represented by $Zn_{1-x}M_xO$, wherein M is Mg, Ca, Zr, W, Li, Ti, Y, Al, or a combination thereof and $0 \leq x \leq 0.5$.

In an embodiment, the aforementioned quantum dots included in the electroluminescent device are provided.

The quantum dots include a semiconductor nanocrystal core including indium (In) and phosphorous (P), a first semiconductor nanocrystal shell disposed on the semiconductor nanocrystal core, first semiconductor nanocrystal shell including zinc and selenium, and a second semiconductor nanocrystal shell disposed on the first semiconductor nanocrystal shell, second semiconductor nanocrystal shell including zinc and sulfur, wherein the quantum dots do not include cadmium, and wherein a difference between a maximum photoluminescent peak wavelength and a first absorption peak wavelength of the quantum dots is less than or equal to about 20 nm.

A wavelength of the maximum photoluminescent peak of the quantum dots may be greater than or equal to about 600 nm and less than or equal to about 650 nm.

The quantum dots may have an average particle size of greater than or equal to about 8 nm.

The quantum dots may have an average particle size of greater than or equal to about 8.5 nm.

The quantum dots may have an average particle size of greater than about 9 nm.

The quantum dots may have an average particle size of greater than about 10 nm.

A standard deviation of a particle size distribution of the quantum dots may be less than or equal to about 20% of an average size thereof.

A quantum yield of the quantum dots may be greater than or equal to about 60%. A full width at half maximum of the maximum photoluminescent peak of the quantum dots may be less than or equal to about 40 nm.

The first semiconductor nanocrystal shell may be disposed directly on a surface of the semiconductor nanocrystal core, the first semiconductor nanocrystal shell may not include sulfur, and the second semiconductor nanocrystal shell may be an outermost layer of the quantum dot.

In the quantum dots, a molar ratio of indium to a sum of sulfur and selenium (i.e., In:(Se+S), hereinafter which may be recited as the value of In:(Se+S)) may be less than 0.1:1.

In the quantum dots, a molar ratio of indium to a sum of sulfur and selenium may be greater than or equal to about 0.02:1.

In the quantum dots, a molar ratio of zinc to indium may be greater than or equal to about 10:1.

In the quantum dots, a molar ratio of zinc to indium may be less than about 52:1.

A thickness of the first semiconductor nanocrystal shell may be greater than or equal to about 6 monolayers, greater than or equal to about 7 monolayers, greater than or equal to about 8 monolayers, greater than or equal to about 9 monolayers, or greater than or equal to about 10 monolayers.

The difference between the maximum photoluminescent peak wavelength and the first absorption peak wavelength of the quantum dots may be less than or equal to about 17 nm (less than or equal to about 16 nm).

In other embodiment, quantum dots include:

a semiconductor nanocrystal core comprising indium and phosphorous, a first semiconductor nanocrystal shell disposed on the semiconductor nanocrystal core, the first semiconductor nanocrystal shell comprising zinc and selenium, and a second semiconductor nanocrystal shell disposed on the first semiconductor nanocrystal shell, the second semiconductor nanocrystal shell comprising zinc and sulfur, wherein in the quantum dots, a molar ratio of indium to a sum of sulfur and selenium In:(Se+S) is greater than or equal to about 0.02:1 and less than or equal to about 0.1:1, wherein the quantum dots do not include cadmium, and wherein an average particle size of the quantum dots is greater than or equal to about 8 nanometers and less than or equal to about 50 nm.

In an embodiment, a composition that may include an organic solvent and the aforementioned cadmium free quantum dots is provided.

The electroluminescent device of an embodiment is based on, e.g., includes, environmentally friendly quantum dots and may show, e.g., exhibit, enhanced electroluminescent properties (e.g., improved external quantum efficiency (EQE) and increased maximum luminance) together with improved stability.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
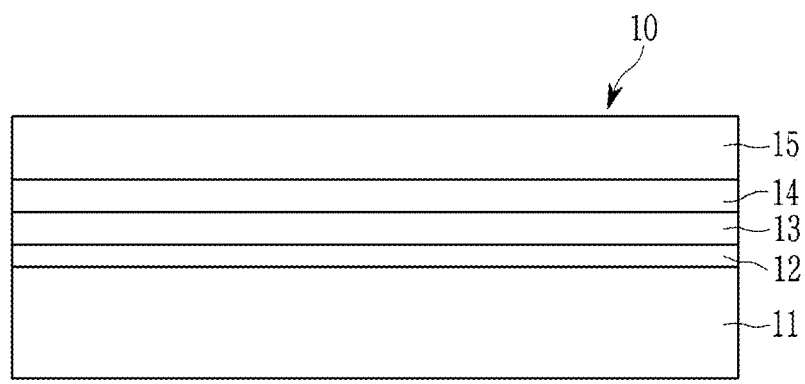
FIG. 1 is a schematic cross-sectional view of a quantum dot light emitting diode (QD LED) device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, a work function or an energy level (e.g., highest occupied molecular orbital (HOMO) energy level or a lowest unoccupied molecular orbital (LUMO) energy level) is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, the term "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkyl ester group, a C3 to C30 alkenyl ester group (e.g., an acrylate group, methacrylate group), a C6 to C30 aryl group, a C7 to C30 alkylaryl group, a 01 to C30 alkoxy group, a 01 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N (NH$_2$)), an aldehyde group (—C(=O)H), a carbamoyl group (—C(O)NH$_2$), a thiol group (—SH), an ester group (RCOO— or —O(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hydrocarbon" refers to a group including carbon and hydrogen (e.g., alkyl, alkenyl, alkynyl, aryl, or the like). The hydrocarbon group may be a group having a valence of at least one formed by a removal of at least one hydrogen from an alkane, an alkene, an alkyne, an arene, or the like. At least one methylene in the hydrocarbon group may be replaced with an oxide moiety, a carbonyl moiety, an ester moiety, —NH—, or a combination thereof.

As used herein, when a definition is not otherwise provided, "aliphatic" refers to a C1 to C40 linear or branched hydrocarbon (e.g., alkyl, alkenyl, or alkynyl) group.

As used herein, when a definition is not otherwise provided, "alkoxy" refers to an alkyl group that is linked via an oxygen (i.e., alkyl-O—), for example, methoxy, ethoxy, and sec-butyloxy groups.

As used herein, when a definition is not otherwise provided, "alkyl" refers to a straight or branched chain, saturated, monovalent (e.g., C1 to C40) hydrocarbon group (e.g., methyl or hexyl).

As used herein, when a definition is not otherwise provided, "alkylene" refers to a straight or branched saturated (e.g., C2 to C40) aliphatic hydrocarbon group having at least two valences and optionally substituted with at least one substituent.

As used herein, when a definition is not otherwise provided, "alkynyl" refers to a straight or branched chain, monovalent (e.g., C2 to C40) hydrocarbon group having at least one carbon-carbon triple bond (e.g., ethynyl).

As used herein, when a definition is not otherwise provided, "aromatic" refers to an organic compound or group comprising at least one unsaturated cyclic group having delocalized pi electrons. The term encompasses both aromatic hydrocarbon compounds and heteroaromatic compounds.

As used herein, when a definition is not otherwise provided, "aryl" refers to a hydrocarbon group having a valence of at least one, for example, formed by the removal of at least one hydrogen atom from one or more rings of an arene (e.g., phenyl or naphthyl).

As used herein, when a definition is not otherwise provided, the term "hetero" refers to inclusion of at least one (e.g., one to three) heteroatoms, where the heteroatom(s) may be N, O, S, Si, or P, preferably N, O, or S.

As used herein, when a definition is not otherwise provided, an "amine" group has the general formula —NRR, wherein each R is independently hydrogen, a C1-C40 alkyl group, a C7-C40 alkylaryl group, a C7-C40 arylalkyl group, or a C6-C40 aryl group.

As used herein, when a definition is not otherwise provided, "arene" refers to a hydrocarbon having an aromatic ring, and includes monocyclic and polycyclic hydrocarbons wherein the additional ring(s) of the polycyclic hydrocarbon may be aromatic or nonaromatic. Specific examples of arenes include benzene, naphthalene, toluene, and xylene.

As used herein, when a definition is not otherwise provided, "arylalkyl" refers to a substituted or unsubstituted aryl group covalently linked to an alkyl group that is linked to a compound (e.g., a benzyl is a C7 arylalkyl group).

As used herein, when a definition is not otherwise provided, "heteroaryl" refers to an aromatic group that comprises at least one heteroatom covalently bonded to one or more carbon atoms in an aromatic ring.

As used herein, an average size of particles (or quantum dots) may be determined by using an electron microscope analysis and optionally a commercially available image analysis program (Image J). The average may be mean or median.

Hereinafter, a light emitting device according to an embodiment is described with reference to drawings.

FIG. 1 is a schematic cross-sectional view of an electroluminescent device (hereinafter, also referred to as a light emitting device) according to an embodiment.

Referring to FIG. 1, a light emitting device 10 according to an embodiment includes a first electrode 11 and a second electrode 15 facing each other, and an emissive layer 13 disposed between the first electrode 11 and the second electrode 15 and including quantum dots. A hole auxiliary layer 12 may be disposed between the first electrode 11 and the emissive layer 13. An electron auxiliary layer 14 may be disposed between the second electrode 15 and the emissive layer 13.

The device may further include a substrate. The substrate may be disposed on a major surface (e.g., lower surface) of the first electrode 11 or on a major surface (e.g., upper surface) of the second electrode 15. In an embodiment, the substrate may be disposed on a major surface (e.g., lower surface) of the first electrode. The substrate may be a substrate including an insulation material (e.g., insulating transparent substrate). The substrate may include glass; a polymer such as a polyester (e.g., polyethylene terephthalate (PET), polyethylene naphthalate (PEN)), a polycarbonate, a polyacrylate, a polyimide, a polyamideimide, or a combination thereof; a polysiloxane (e.g., PDMS); an inorganic material such as $Al_2O_3$, ZnO, or a combination thereof; or a combination thereof, but is not limited thereto. The substrate may be made of a silicon wafer. Herein "transparent" may refer to a case where the substrate has a transmittance of greater than or equal to about 85%, for example, greater than or equal to about 88%, greater than or equal to about 90%, greater than or equal to about 95%, greater than or equal to about 97%, or greater than or equal to about 99% for light of a predetermined wavelength (e.g., light emitted from the quantum dots). A thickness of the substrate may be appropriately selected taking into consideration a substrate material but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or fluorine doped tin oxide; or a combination of a metal and a metal oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode.

The second electrode 15 may be made of a conductor, for example, a metal, a conductive metal oxide, a conductive polymer, or a combination thereof. The second electrode 15 may be made of, for example, a metal or an alloy thereof such as aluminum, magnesium, calcium, sodium, potassium, titanium, indium, yttrium, lithium, gadolinium, silver, tin, lead, cesium, or barium; or a multi-layer structured material such as LiF/Al, $Li_2O$/Al, Liq/Al, LiF/Ca, or $BaF_2$/Ca, but is not limited thereto. The conductive metal oxide is the same as described above.

A work function of the first electrode may be higher than a work function of the second electrode. A work function of the first electrode may be lower than a work function of the second electrode.

In an embodiment, a work function of the first electrode 11 may be from about 4.5 electronvolts (eV) to about 5.0 eV (e.g., from about 4.6 eV to about 4.9 eV). The work function of the second electrode 15 may be greater than or equal to about 4.0 eV and less than about 4.5 eV (e.g., from about 4.0 eV to about 4.3 eV).

In an embodiment, a work function of the second electrode 15 may be from about 4.5 eV to about 5.0 eV (e.g., from about 4.6 eV to about 4.9 eV). The work function of the first electrode 11 may be greater than or equal to about 4.0 eV and less than about 4.5 eV (e.g., from about 4.0 eV to about 4.3 eV).

The first electrode 11, the second electrode 15, or a combination thereof may be a light-transmitting electrode and the light-transmitting electrode may be, for example, made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of, for example, an opaque conductor such as aluminum (Al), silver (Ag), or gold (Au).

A thickness of the electrodes (the first electrode, the second electrode, or a combination thereof) is not particularly limited and may be appropriately selected taking into consideration device efficiency. For example, the thickness of the electrodes may be greater than or equal to about 5 nm, for example, greater than or equal to about 50 nm. For example, the thickness of the electrodes may be less than or equal to about 100 micrometers ($\mu m$), for example, less than or equal to about 10 $\mu m$, less than or equal to about 1 $\mu m$, less than or equal to about 900 nm, less than or equal to about 500 nm, or less than or equal to about 100 nm.

The emissive layer 13 includes (e.g., a plurality of) quantum dots. The quantum dots (hereinafter, also referred to as semiconductor nanocrystals) may absorb light from an excitation source to be excited and may emit energy (a light of a wavelength) corresponding to an energy bandgap of the quantum dots. The energy bandgap of the quantum dots may vary with a size and a composition of the semiconductor nanocrystal. For example, as the size of a quantum dot increases, the quantum dot may have a narrower energy bandgap, thereby having an increased luminous wavelength. Semiconductor nanocrystals may be used as a light emitting material in various fields such as a display device, an energy device, or a bio light emitting device.

Quantum dots having a photoluminescence (PL) property at an applicable level may include cadmium (Cd). Cadmium may cause environment/health problems and is one of the restricted elements via Restriction of Hazardous Substances Directive (RoHS) in many countries. A cadmium-free quantum dot may exhibit low electroluminescent properties and poor stability in comparison with a cadmium-based quantum dot. Accordingly, development of a cadmium-free semiconductor nanocrystal particle having improved photoluminescence characteristics (e.g., reduced full width at half maximum (FWHM), enhanced EQE, increased luminance, or the like) and an electroluminescent device including the same are desired. For example, for the realization of a QD LED device (i.e., a display device without a light source), a red light emitting and environmentally friendly quantum dot capable of exhibiting enhanced electroluminescent properties is necessary. While an indium phosphide-based quantum dot is a type of cadmium-free and red light emitting quantum dot, an Indium phosphide-based quantum dot may exhibit an insufficient level of electroluminescent properties. For instance, an indium phosphide-based and red-light emitting quantum dot may exhibit an EQE of less than or equal to about 2.5%. Moreover, it may not be easy to improve the stability (e.g., the life time) of red-light emitting cadmium-free quantum dots.

The present inventors have found that the quantum dots having the features descried herein may exhibit improved electroluminescent properties. The present inventors have also found that the quantum dots may exhibit improved properties in an electroluminescent device (if desired when the quantum dots are combined with a zinc metal oxide-based electron transporting layer that will be described below). The quantum dots included in the device of an embodiment may have the size, the composition, the properties (e.g., the Stokes shift), or a combination thereof that will be described below by controlling the preparation conditions (e.g., controlling the factors that may affect the growth rate of the core, shell, or a combination thereof such as a reaction temperature, an injection rate of a precursor, types and amounts of the precursor, or a combination thereof). When the quantum dots of an embodiment are combined with an inorganic electron auxiliary layer (e.g., an ETL) including a metal oxide comprising zinc such as a zinc oxide, a zinc magnesium oxide, or the like, the quantum dots may exhibit a high EQE and a high luminance (e.g., a EQE of greater than or equal to about 9% and a maximum luminance of greater than or equal to about 10,000 cd/m$^2$ that may be difficult to achieve for cadmium free quantum dots. For a red-light emitting electroluminescent device based on cadmium free quantum dots, increasing both of the EQE and the brightness may be desired. Moreover, the device including the quantum dots of an embodiment may exhibit improved stability.

Accordingly, an embodiment is related to the quantum dots (or a population of the quantum dots) that will be described in detail below. The quantum dots of an embodiment do not include cadmium. The quantum dots of an embodiment may not include a toxic heavy metal such as cadmium, mercury, lead, or a combination thereof.

The quantum dot includes a semiconductor nanocrystal core including indium (In) and phosphorous (P), a first semiconductor nanocrystal shell disposed on the semiconductor nanocrystal core and including zinc and selenium, and a second semiconductor nanocrystal shell disposed on the first semiconductor nanocrystal shell and including zinc and sulfur.

The quantum dots may have a maximum photoluminescent peak in a red light wavelength region. The quantum dots may have a maximum photoluminescent peak in a green light wavelength region.

When the quantum dots emit red light, a maximum photoluminescent peak wavelength of the quantum dots may be greater than or equal to about 600 nm, greater than or equal to about 610 nm, greater than or equal to about 611 nm, greater than or equal to about 612 nm, greater than or equal to about 613 nm, greater than or equal to about 614 nm, greater than or equal to about 615 nm, greater than or equal to about 616 nm, greater than or equal to about 617 nm, greater than or equal to about 618 nm, greater than or equal to about 619 nm, or greater than or equal to about 620 nm. The maximum photoluminescent peak wavelength of the quantum dots may be less than or equal to about 650 nm, less than or equal to about 640 nm, less than or equal to about 635 nm, less than or equal to about 634 nm, less than or equal to about 633 nm, less than or equal to about 632 nm, less than or equal to about 631 nm, or less than or equal to about 630 nm.

In a UV-Vis absorption spectrum of the quantum dots, the first absorption peak wavelength may be present in a range of greater than about 450 nm, greater than or equal to about 500 nm, greater than or equal to about 550 nm, or greater than or equal to about 570 nm, and less than the maximum photoluminescent peak wavelength (e.g., less than or equal to about 620 nm, less than or equal to about 610 nm, less than or equal to about 600 nm, or less than or equal to about 590 nm).

In an embodiment, the quantum dots may emit green light and the first absorption peak wavelength may be greater than or equal to about 480 nm, greater than or equal to about 485 nm, greater than or equal to about 490 nm, greater than or equal to about 500 nm, greater than or equal to about 510 nm, or greater than or equal to about 515 nm. In an embodiment, the quantum dots may emit green light and the first absorption peak wavelength may be, less than or equal to about 540 nm, less than or equal to about 530 nm, less than or equal to about 529 nm, less than or equal to about 528 nm, less than or equal to about 527 nm, less than or equal to about 526 nm, less than or equal to about 525 nm, less than or equal to about 524 nm, less than or equal to about 523 nm, less than or equal to about 522 nm, less than or equal to about 521 nm, or less than or equal to about 520 nm.

In an embodiment, the quantum dots may emit red light and the first absorption peak wavelength may be greater than or equal to about 595 nm, greater than or equal to about 596 nm, greater than or equal to about 597 nm, greater than or equal to about 598 nm, greater than or equal to about 599 nm, greater than or equal to about 600 nm, greater than or equal to about 601 nm, greater than or equal to about 602 nm, greater than or equal to about 603 nm, greater than or equal to about 604 nm, greater than or equal to about 605 nm, greater than or equal to about 606 nm, greater than or equal to about 607 nm, greater than or equal to about 608 nm, greater than or equal to about 609 nm, greater than or equal to about 610 nm, greater than or equal to about 611 nm, or greater than or equal to about 612 nm.

In an embodiment, the quantum dots may emit red light and the first absorption peak wavelength may be less than or equal to about 625 nm, less than or equal to about 624 nm, less than or equal to about 623 nm, less than or equal to about 622 nm, less than or equal to about 621 nm, less than or equal to about 620 nm, or less than or equal to about 619 nm.

A difference between the wavelength of the maximum photoluminescent peak and the first absorption peak wavelength (hereinafter, also referred to as a Stokes shift) may be less than or equal to about 20 nm, less than or equal to about 19 nm, less than or equal to about 18 nm, less than or equal to about 17 nm, or less than or equal to about 16 nm.

In a quantum dot, a Stokes shift refers to a difference between the absorption energy and the photoluminescence energy. Thus, the Stokes shift may be represented by a difference between a first absorption peak wavelength (nm) (or energy, microelectronvolts (meV)) in a UV-Vis absorption spectrum and a maximum photoluminescence peak wavelength (energy) in a photoluminescence spectrum. As used herein, the "first absorption peak (or first excitation absorption peak)" refers to a main peak appearing first from a lower energy region in a UV-Vis absorption spectrum. Without wishing to be bound any theory, it is believed that the Stokes shift may depend on a size, a composition, or a combination thereof of quantum dot particles. Without wishing to be bound any theory, it is also believed that a surface state of the quantum dots (e.g., presence of surface defect(s)) also may have an influence on the Stokes shift. Thus, the Stokes shift of the quantum dots may represent a size, a composition, a surface state, or a combination thereof of the quantum dot. The present inventors have also found that the Stokes shift of the core-shell quantum dots may have a direct effect on the electroluminescent properties and the stability (e.g., T50 life time) of the device including the quantum dots.

The quantum dots may have an average particle size of greater than or equal to about 8 nm, greater than or equal to about 9 nm, or greater than or equal to about 10 nm. The average particle size of the quantum dots may be less than or equal to about 50 nm, less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, or less than or equal to about 13 nm. The particle size of the quantum dots may be a diameter of the particle. When the particle is non-spherical, the size of the quantum dots may be a diameter (e.g., equivalent diameter) converted from an area of a two-dimensional image obtained from an electron microscope analysis into a circle.

A particle size distribution of the quantum dots may be less than or equal to about 20%, less than or equal to about 19%, less than or equal to about 18%, less than or equal to about 17%, less than or equal to about 16%, or less than or equal to about 15% of the average size thereof. In an embodiment, the particle size distribution of the quantum dots may be less than or equal to about 14%, less than or equal to about 13%, less than or equal to about 12%, less than or equal to about 11%, or less than or equal to about 10% of the average particle size thereof. A particle size distribution of the quantum dots may be greater than or equal to about 5%, greater than or equal to about 6%, greater than or equal to about 7%, greater than or equal to about 8%, greater than or equal to about 9%, greater than or equal to about 10%, or greater than or equal to about 11% of the average particle size thereof.

The quantum dots may have a quantum yield of greater than or equal to about 60%, greater than or equal to about 65%, greater than or equal to about 70%, greater than or equal to about 75%, or greater than or equal to about 80%.

In an embodiment, the semiconductor nanocrystal core may include an indium phosphide. The semiconductor nanocrystal core may further include zinc. The semiconductor nanocrystal core may not include zinc. A size of the core may be selected appropriately. In an embodiment, the size of the core may be greater than or equal to about 1 nm, greater than or equal to about 1.5 nm, greater than or equal to about 2 nm, or greater than or equal to about 2.5 nm. In an embodiment, the size of the core may be less than or equal to about 5 nm, less than or equal to about 4 nm, less than or equal to about 4.5 nm, less than or equal to about 3.5 nm, or less than or equal to about 3 nm.

The first semiconductor nanocrystal shell may include a zinc selenide (e.g., ZnSe). The first semiconductor nanocrystal shell may not include sulfur (S). In an embodiment, the first semiconductor nanocrystal shell may not include ZnSeS. The first semiconductor nanocrystal shell may be disposed directly on the semiconductor nanocrystal core.

The first semiconductor nanocrystal shell may have a thickness of greater than about 4 monolayers (ML), for example, greater than about 4.5 MLs, greater than or equal to about 5 MLs, greater than or equal to about 6 MLs, greater than or equal to about 7 MLs, or greater than or equal to about 8 MLs. In an embodiment, a thickness of the first semiconductor nanocrystal shell may be greater than or equal to about 9 MLs, or greater than or equal to about 10 MLs. A thickness of the first semiconductor nanocrystal shell may be less than about 5 nm. A thickness of the first semiconductor nanocrystal shell may be less than or equal to about 15 MLs, less than or equal to about 14 MLs, or less than or equal to about 13 MLs.

The second semiconductor nanocrystal shell may include a zinc sulfide (e.g., ZnS). The second semiconductor nanocrystal shell may not include selenium. The second semiconductor nanocrystal shell may disposed directly on the first semiconductor nanocrystal shell. A thickness of the second semiconductor nanocrystal shell may be selected appropriately. The second semiconductor nanocrystal shell may be an outermost layer of the quantum dots. In an embodiment, the quantum dots may have a core-multi shell structure wherein the quantum dots include a core including an indium phosphide (e.g., InP or InZnP), a first shell disposed directly on the core and including ZnSe, and a second shell disposed directly on the first shell and including ZnS.

In an embodiment, the quantum dots may include an InP core (e.g., may emit red light) and an amount of the indium with respect to the chalcogen element may be in a predetermined range.

In the quantum dots of an embodiment, a molar ratio of indium to a sum of sulfur and selenium (i.e., [In:(Se+S)], hereinafter which may be recited as the value of [In/(Se+S)]) may be less than 0.1:1, less than or equal to about 0.09:1, less than or equal to about 0.08:1, less than or equal to about 0.07:1, less than or equal to about 0.06:1, or less than or equal to about 0.05:1. The molar ratio of indium to a sum of sulfur and selenium may be greater than or equal to about 0.02:1, greater than or equal to about 0.03:1, or greater than or equal to about 0.04:1.

In the quantum dots of an embodiment, a molar ratio of sulfur to selenium (S/Se) may be less than 4.5:1, for example, less than or equal to about 4:1, less than or equal to about 3.5:1, less than or equal to about 3:1, less than or equal to about 2.5:1, less than or equal to about 2:1, less than or equal to about 1.5:1, or less than or equal to about 1:1. In the quantum dots of an embodiment, a molar ratio of sulfur to selenium (S/Se) may be greater than or equal to about 0.01:1, greater than or equal to about 0.05:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.20:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, or greater than or equal to about 0.9:1.

In the quantum dots, a molar ratio of zinc to indium may be greater than or equal to about 15:1, greater than or equal to about 16:1, greater than or equal to about 17:1, greater than or equal to about 18:1, greater than or equal to about 19:1, greater than or equal to about 20:1, greater than or equal to about 21:1, or greater than or equal to about 22:1.

In the quantum dots, a molar ratio of zinc to indium may be less than about 52:1, less than or equal to about 51:1, less than or equal to about 50:1, less than or equal to about 49:1, less than or equal to about 48:1, or less than or equal to about 47:1.

A shape of the quantum dots is not particularly limited, and may, for example, be a spherical, polyhedron, pyramid, multipod, or cube shape, nanotube, nanowire, nanofiber, nanosheet, or a combination thereof, but is not limited thereto.

The quantum dots may include the organic ligand, the organic solvent, or a combination thereof, which will be described below, on a surface of the quantum dots. The organic ligand, the organic solvent, or a combination thereof may be bound to the surface of the quantum dot.

In an embodiment, a method of producing the aforementioned quantum dots includes: providing the aforementioned semiconductor nanocrystal core; and forming a shell on the core.

The formation of the shell may include:
heating a first mixture including a first shell precursor containing zinc, an organic ligand, and an organic solvent;
adding a semiconductor nanocrystal core (for example, not in a heated state) including indium and phosphorous to the heated first mixture,
heating the first mixture to a first reaction temperature and adding a selenium containing precursor to the first mixture to conduct a reaction for a predetermined time period,
increasing a temperature of a resulting mixture to a second reaction temperature and adding a selenium containing precursor and a sulfur containing precursor separately to conduct a reaction.

The method may further include adding the first shell precursor to the resulting mixture.

Amounts of the selenium containing precursor and the sulfur containing precursor with respect to the core (and optionally the added amount of the precursors, the temperature of adding the precursor, the reaction temperature and time, or a combination thereof) may be controlled in order to obtain a desired composition and size (e.g., in the aforementioned ranges) of the quantum dots and the properties thereof (e.g., the Stokes shift).

Details of the quantum dots are the same as set forth above.

The first shell precursor is not particularly limited and may be selected appropriately. In an embodiment, the first shell precursor may include a Zn metal powder, an alkylated Zn compound, a Zn alkoxide, a Zn carboxylate, a Zn nitrate, a Zn perchlorate, a Zn sulfate, a Zn acetylacetonate, a Zn halide, a zinc carbonate, a Zn cyanide, a Zn hydroxide, a Zn oxide, a Zn peroxide, or a combination thereof. Examples of the first shell precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. One shell precursor or a plurality of different first shell precursors may be used.

In an embodiment, the organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $RHPOOH$ (wherein R and R' are the same or different, and are each independently a C1 to C40 (e.g., C3 to C24) aliphatic hydrocarbon group such as an alkyl, an alkenyl, or an alkynyl group or a C6 to C20 aromatic hydrocarbon group such as an aryl group such as a phenyl group), a polymeric organic ligand, or a combination thereof.

The organic ligand may coordinate, e.g., bind, to the surface of the obtained nanocrystal, and may allow the nanocrystal to be well dispersed in the solution, have an effect on the light emitting and electrical properties of the quantum dot, or a combination thereof.

Examples of the organic ligand compound may include:

a thiol compound such as methane thiol, ethane thiol, propane thiol, butane thiol, pentane thiol, hexane thiol, octane thiol, dodecane thiol, hexadecane thiol, octadecane thiol, benzyl thiol, or a combination thereof;

an amine compound such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, trioctylamine, or a combination thereof;

a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, or a combination thereof;

a phosphine compound such as methyl phosphine, ethyl phosphine, propyl phosphine, butyl phosphine, pentyl phosphine, octyl phosphine, dioctyl phosphine, tributyl phosphine, trioctyl phosphine, or a combination thereof;

a phosphine oxide compound such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide, or a combination thereof;

diphenyl phosphine, triphenyl phosphine, or an oxide compound thereof, or a combination thereof;

a mono- or di(C5 to C20 alkyl)phosphinic acid such as mono- or dihexyl phosphinic acid, mono- or dioctyl phosphinic acid, mono- or didodecyl phosphinic acid, mono- or di(tetradecyl)phosphinic acid, mono- or di(hexadecyl)phosphinic acid, mono- or di(octadecyl)phosphinic acid, or a combination thereof;

a C5 to C20 alkyl phosphonic acid such as hexyl phosphonic acid, octyl phosphonic acid, dodecyl phosphonic acid, tetradecyl phosphonic acid, hexadecyl phosphonic acid, octadecyl phosphonic acid, or a combination thereof;

or a combination thereof.

One or more organic ligands may be used.

Examples of the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, squalene, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) containing at least one (e.g., 1, 2, or 3) C6 to C22 alkyl group, a phosphine oxide (e.g., trioctyl phosphine oxide) containing at least one (e.g., 1, 2, or 3) C6 to C22 alkyl group, a C12 to C22 aromatic ether such as a phenyl ether or a benzyl ether, or a combination thereof.

The solvent and amount of the solvent used may be selected taking into consideration the precursor and organic ligands used.

The first mixture may be heated to a temperature of greater than or equal to about 100° C., greater than or equal to about 120° C., greater than or equal to about 150° C., greater than or equal to about 200° C., greater than or equal to about 250° C., or greater than or equal to about 270° C., for example, under vacuum, an inert atmosphere, or a combination thereof for a predetermined time period (e.g., greater than or equal to about 5 minutes and less than or equal to about 1 hour (hr)).

Details of the semiconductor nanocrystal core including indium and phosphorous are the same as set forth above. The core may be commercially available or may be synthesized in a suitable method. A method of preparing the core is not particularly limited and a suitable method of producing an indium phosphide-based core may be used. In an embodiment, the core may be formed by a hot injection manner wherein a solution including a metal precursor (e.g., an indium precursor) and optionally a ligand is heated to a high temperature (e.g., of greater than or equal to about 200° C.) and a phosphorous precursor is injected to the hot solution.

The selenium containing precursor is not particularly limited and may be selected appropriately. For example, the selenium containing precursor may include selenium-trioctyl phosphine (Se-TOP), selenium-tributyl phosphine (Se-TBP), selenium-triphenyl phosphine (Se-TPP), or a combination thereof, but is not limited thereto.

The first reaction temperature may be greater than or equal to about 280° C., greater than or equal to about 290° C., greater than or equal to about 300° C., greater than or equal to about 310° C., or greater than or equal to about 315° C. and less than or equal to about 350° C., less than or equal to about 340° C., or less than or equal to about 330° C.

After or during the heating of the second mixture to the first reaction temperature, a selenium containing precursor may be injected at least one time (e.g., at least twice or at least three times).

The reaction mixture may be kept at the first reaction temperature for a predetermined time period (e.g., from 10 minutes to 60 minutes, from 15 minutes to 55 minutes, or from 20 minutes to 50 minutes). Accordingly, a first semiconductor nanocrystal shell including zinc and selenium may be formed to obtain a mixture including a particle of the aforementioned shell on the core.

Then, a temperature of the mixture may be raised to a second reaction temperature, during which or when the mixture reaches the second reaction temperature, a selenium containing precursor may be added again. The second reaction temperature may be greater than about the first reaction temperature. In an embodiment, the second reaction temperature may be greater than the first reaction temperature by at least about 10° C., at least about 20° C., or at least about 30° C. The second reaction temperature may be controlled in a range of from about 270° C. to about 350° C., from about 275° C. to about 345° C., from about 280° C. to about 340° C., from about 285° C. to about 335° C., from about 290° C. to about 330° C., or from about 295° C. to about 325° C.

The first reaction temperature, the second reaction temperature, and the time period at each of the reaction temperatures may be selected taking into consideration a desired thickness of the shell including the first semiconductor nanocrystal, a desired thickness of the shell including the second semiconductor nanocrystal, the precursors, or the like. In an embodiment, the first and the second temperatures, the duration at each of the reaction temperatures, and the amounts of the precursor may be controlled such that the first semiconductor nanocrystal shell may have a thickness of the aforementioned range.

In the reaction system, an amount of the selenium as added per one mole of the indium may be greater than or equal to about 10 moles, greater than or equal to about 15 moles, greater than or equal to about 20 moles, greater than or equal to about 25 moles, greater than or equal to about 30 moles, greater than or equal to about 35 moles, greater than or equal to about 40 moles, or greater than or equal to about 45 moles and less than or equal to about 50 moles, less than or equal to about 45 moles, less than or equal to about 40 moles, less than or equal to about 35 moles, less than or equal to about 30 moles, less than or equal to about 25 moles, or less than or equal to about 20 moles, but is not limited thereto. The amount of the selenium may be selected taking into consideration the reaction temperature/time, a desired thickness of the first semiconductor nanocrystal shell, the selenium containing precursor, or a combination thereof.

The injection of the sulfur precursor may begin after (for example, the entire amount of) the selenium containing precursor as added is used (consumed) in the reaction mixture.

In an embodiment, the method may not include decreasing the temperature of the reaction mixture (for example, at or below 100° C., at or below 50° C., or at or below 30° C., or at room temperature).

The sulfur containing precursor is not particularly limited and may be selected appropriately. The sulfur containing precursor may include hexane thiol, octane thiol, decane thiol, dodecane thiol, hexadecane thiol, mercapto propyl silane, sulfur-trioctyl phosphine (S-TOP), sulfur-tributyl phosphine (S-TBP), sulfur-triphenyl phosphine (S-TPP), sulfur-trioctylamine (S-TOA), trimethylsilyl sulfide, ammonium sulfide, sodium sulfide, or a combination thereof. The sulfur containing precursor may be injected at least on time (e.g., at least twice).

In the reaction system, the amount of the sulfur containing precursor with respect to the indium of the core may be selected taking into consideration a desired composition of the resulting quantum dots, a reactivity of the sulfur containing precursor, and the second reaction temperature.

In an embodiment, the an amount of the sulfur as added per one mole of the indium may be greater than or equal to about 1 moles, greater than or equal to about 3 moles, greater than or equal to about 5 moles, greater than or equal to about 7 moles, greater than or equal to about 9 moles, greater than or equal to about 11 moles, greater than or equal to about 13 moles, or greater than or equal to about 15 moles and less than or equal to about 30 moles, less than or equal to about 25 moles, less than or equal to about 20 moles, less than or equal to about 19 moles, less than or equal to about 18 moles, less than or equal to about 17 moles, less than or equal to about 16 moles, less than or equal to about 15 moles, or less than or equal to about 14 moles, but is not limited thereto.

When a non-solvent is added into a resulting reaction solution as obtained, organic ligand-coordinated quantum dots may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethyl sulfoxide (DMSO), diethylether, formaldehyde, acetaldehyde, but is not limited thereto. The separation may be performed through a centrifugation, precipitation, chromatography, or distillation. The separated nanocrystal may be added to a washing solvent and washed, if desired. The washing solvent is not particularly limited and may include a solvent having a similar solubility parameter to that of the ligand and may, for example, include hexane, heptane, octane, chloroform, toluene, benzene, and the like.

In an embodiment, the emissive layer 13 may have a thickness of greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm. The thickness of the emissive layer 13 may be less than or equal to about 200 nm, less than or equal to about 190 nm, less than or equal to about 180 nm, less than or equal to about 170 nm, less than or equal to about 160 nm, less than or equal to about 150 nm, less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm.

In an embodiment, the emissive layer 13 may have a HOMO energy level that is greater than or equal to about 5.4 eV, greater than or equal to about 5.5 eV, greater than or equal to about 5.6 eV, greater than or equal to about 5.7 eV, greater than or equal to about 5.8 eV, greater than or equal to about 5.9 eV, or greater than or equal to about 6.0 eV. The HOMO energy level of the emissive layer 13 may be less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. The HOMO energy level of the emissive layer 13 may be from about 5.4 eV to about 5.9 eV.

In an embodiment, the emissive layer 13 may have a LUMO energy level that is less than or equal to about 3.9 eV, less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The LUMO energy level of the emissive layer 13 may be greater than or equal to about 2.5 eV, greater than or equal to about 2.6 eV, greater than or equal to about 2.7 eV, or greater than or equal to about 2.8 eV. In an embodiment, the emissive layer 13 may have an energy bandgap of from about 2.4 eV to about 3.5 eV.

In an embodiment, a hole auxiliary layer 12 may be disposed between the first electrode 11 (e.g., anode) and the emission layer 13. The hole auxiliary layer 12 may have one layer or two or more layers, and may include, for example, a hole injection layer (HIL), a hole transport layer (HTL), an electron blocking layer, or a combination thereof.

The hole auxiliary layer 12 may have a HOMO energy level that may match a HOMO energy level of the emission layer 13 and may enforce, e.g., aid, mobility of holes from the hole auxiliary layer 12 into the emission layer 13.

The HOMO energy level of the hole auxiliary layer 12 (e.g., hole transport layer (HTL)) contacting the emission layer may be the same as or less than the HOMO energy level of the emission layer 13 by a value within a range of less than or equal to about 1.0 eV, for example, from about 0.01 eV to about 0.8 eV, from about 0.01 eV to about 0.7 eV, from about 0.01 eV to about 0.5 eV, from about 0.01 eV to about 0.4 eV, from about 0.01 eV to about 0.3 eV, from about 0.01 eV to about 0.2 eV, or from about 0.01 eV to about 0.1 eV.

The HOMO energy level of the hole auxiliary layer 12 may be greater than or equal to about 5.0 eV, greater than or equal to about 5.2 eV, greater than or equal to about 5.4 eV, greater than or equal to about 5.6 eV, or greater than or equal to about 5.8 eV. In an embodiment, the HOMO energy level of the hole auxiliary layer 12 may be from about 5.0 eV to about 7.0 eV, from about 5.2 eV to about 6.8 eV, from about 5.4 eV to about 6.8 eV, from about 5.4 eV to about 6.7 eV, from about 5.4 eV to about 6.5 eV, from about 5.4 eV to about 6.3 eV, from about 5.4 eV to about 6.2 eV, from about 5.4 eV to about 6.1 eV, from about 5.6 eV to about 7.0 eV, from about 5.6 eV to about 6.8 eV, from about 5.6 eV to about 6.7 eV, from about 5.6 eV to about 6.5 eV, from about 5.6 eV to about 6.3 eV, from about 5.6 eV to about 6.2 eV, from about 5.6 eV to about 6.1 eV, from about 5.8 eV to about 7.0 eV, from about 5.8 eV to about 6.8 eV, from about 5.8 eV to about 6.7 eV, from about 5.8 eV to about 6.5 eV, from about 5.8 eV to about 6.3 eV, from about 5.8 eV to about 6.2 eV, or from about 5.8 eV to about 6.1 eV.

In an embodiment, the hole auxiliary layer 12 may include a hole injection layer nearer to the first electrode 11 and a hole transport layer nearer to the emission layer 13. In an embodiment, the HOMO energy level of the hole injection layer may be from about 5.0 eV to about 6.0 eV, about 5.0 eV to about 5.5 eV, about 5.0 eV to about 5.4 eV. In an embodiment, the HOMO energy level of the hole transport layer may be from about 5.2 eV to about 7.0 eV, from about 5.4 eV to about 6.8 eV, from about 5.4 eV to about 6.7 eV, from about 5.4 eV to about 6.5 eV, from about 5.4 eV to about 6.3 eV, from about 5.4 eV to about 6.2 eV, or from about 5.4 eV to about 6.1 eV.

A material included in the hole auxiliary layer 12 (for example, a hole transporting layer or a hole injection layer) is not particularly limited and may include, for example, poly(9,9-dioctyl-fluoren-2,7-diyl-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), a p-type metal oxide (e.g., NiO, $WO_3$, $MoO_3$, etc.), a carbon-based material such as graphene oxide, or a combination thereof, but is not limited thereto.

The electron blocking layer (EBL) may include, for example, poly(3,4-ethylenedioxythiophene):poly(styrene sulfonate) (PEDOT:PSS), poly(9,9-dioctyl-fluoren2,7-diyl-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4,4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected for example, depending on the desired characteristics of each layer. For example, the thickness of each layer may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 is disposed between the emissive layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer, the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In an embodiment, the electron auxiliary layer 14 (e.g., the electron transport layer) may include a plurality of nanoparticles. The nanoparticles include a metal oxide including zinc (e.g., a zinc metal oxide). In a device of an embodiment, the quantum dots having the aforementioned features (e.g., the composition, the size, the Stokes shift, or the like) may achieve desirable electroluminescent properties (e.g., a high level of EQE and an increased luminance) when combined with an electron auxiliary layer based on, e.g., including, a zinc metal oxide. In addition, when combined with an electron auxiliary layer based on, e.g., including, a zinc metal oxide, the device including the aforementioned quantum dots may exhibit improved stability (e.g., an increased $T_{50}$).

The metal oxide may include zinc oxide, zinc magnesium oxide, or a combination thereof. The metal oxide (e.g., the zinc metal oxide) may include $Zn_{1-x}M_xO$ (wherein M is Mg, Ca, Zr, W, Li, Ti, Y, Al, or a combination thereof and $0 \leq x \leq 0.5$). In an embodiment, the M may be magnesium (Mg). In an embodiment, the x may be zero. In an embodiment, the x may be greater than or equal to about 0.01, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, or greater than or equal to about 0.1 and less than or equal to about 0.45, less than or equal to about 0.4, less than or equal to about 0.35, less than or equal to about 0.3, less than or equal to about 0.25, less than or equal to about 0.2, or less than or equal to about 0.15.

An absolute value of a LUMO energy level of quantum dots included in the emissive layer may be less than an absolute value of a LUMO energy level of the metal oxide. In an embodiment, an absolute value of a LUMO energy level of quantum dots may be greater than an absolute value of a LUMO energy level of a metal oxide ETL.

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
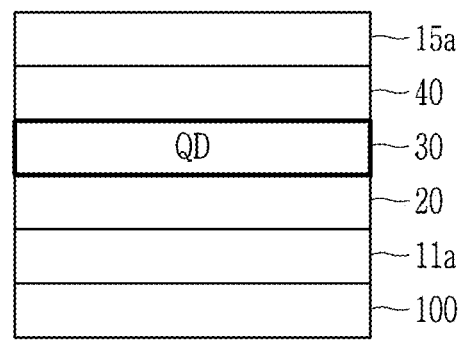
FIG. 2 is a schematic cross-sectional view of a QD LED device according to an embodiment.

A device according to an embodiment has a normal structure. In a device according to an embodiment, an anode 11a disposed on a transparent substrate 100 may include a metal oxide-based transparent electrode (e.g., ITO electrode) and a cathode 15a facing the anode may include a metal (Mg, Al, etc.) of a relatively low work function. For example, a hole auxiliary layer 20, for example, a hole transport layer including TFB, poly(9-vinylcarbazole) (PVK), or a combination thereof; a hole injection layer including PEDOT:PSS, a p-type metal oxide, or a combination thereof; or a combination thereof may be disposed between the anode 11a, e.g., a transparent anode, and the emissive layer 30. An electron auxiliary layer 40 such as an electron injection layer/transport layer may be disposed between the quantum dot emissive layer 30 and the cathode 15a. (see FIG. 2)

Figure 3:
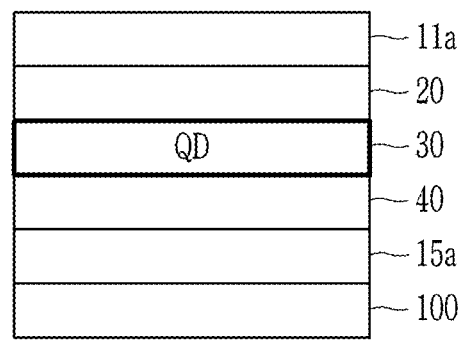
FIG. 3 is a schematic cross-sectional view of a QD LED device according to an embodiment.

A device according to an embodiment has an inverted structure. Herein, the cathode 15a disposed on a transparent substrate 100 may include a metal oxide-based transparent electrode (e.g., ITO) and the anode 11a facing the cathode may include a metal (e.g., Au, Ag, etc.) of a relatively high work function. For example, an n-type metal oxide (ZnO) may be disposed between the cathode 15a, e.g., a transparent cathode, and the emissive layer 30 as an electron auxiliary layer 40 (e.g., an electron transport layer (ETL)). $MoO_3$ or another p-type metal oxide as a hole auxiliary layer 20 (e.g., a hole transport layer (HTL) including TFB, PVK, or a combination thereof; a hole injection layer (HIL) including $MoO_3$ or another p-type metal oxide; or a combination thereof) may be disposed between the metal anode 11a and the quantum dot emissive layer 30 as a hole auxiliary layer (e.g., hole transport layer (HTL)). (see FIG. 3)

An embodiment is related to a method of preparing the aforementioned electroluminescent device.

The method includes: forming an emissive layer including the quantum dots (e.g., a pattern of the aforementioned quantum dots) on a first electrode; optionally forming a charge auxiliary layer on the emissive layer; and forming a second electrode on the emissive layer (or optionally the charge auxiliary layer). The charge auxiliary layer may be an electron auxiliary layer. The method may further include forming a charge auxiliary layer (e.g., a hole auxiliary layer) on the first electrode prior to the formation of the emissive layer. In this case, the emissive layer may be formed on the charge auxiliary layer disposed on the first electrode.

Details of the first electrode, the emissive layer, the charge auxiliary layer, and the second electrode are the same as set forth above.

The formation of the electrode/hole auxiliary layer/electron auxiliary layer is not particularly limited and may be selected appropriately taking into consideration the material, the thickness of the electrode/layer to prepare, or the like. The formation may be carried out via a solution process, a (physical or chemical) deposition process, or a combination thereof.

Forming the emissive layer may be carried out by obtaining a composition including the quantum dots and an organic solvent, and applying or depositing the composition on a substrate, an electrode, or a charge auxiliary layer (e.g., through spin coating, inkjet printing, or contact printing). The formation of the emissive layer may include heat-treating the applied or deposited quantum dot layer. A temperature for the heat treating is not particularly limited and may be selected appropriately taking into consideration a boiling point of the organic solvent. In an embodiment, the heat treating may be carried out at a temperature of greater than or equal to about 60° C. The organic solvent for the composition is not particularly limited and may be selected appropriately. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

Formation of the emissive layer may be carried out by preparing an ink composition including the aforementioned quantum dots of an embodiment and a liquid vehicle, and depositing the prepared ink composition (for example, via an ink-jet printing method). Accordingly, an embodiment is related to an ink composition including the aforementioned quantum dots and a liquid vehicle.

The ink composition may further include a light diffusing particle, a binder (e.g., a binder having a carboxylic acid group), and optionally at least one additive (e.g., a photopolymerizable monomer (e.g., a monomer having a carbon-carbon double bond, a crosslinker, an initiator (e.g., photoinitiator), or a thiol compound, or the like). The light diffusing particle may include $TiO_2$, $SiO_2$, $BaTiO_3$, ZnO, or a combination thereof. The light diffusing particle may have a size of greater than or equal to about 100 nm and less than or equal to about 1 μm.

The liquid vehicle may include an organic solvent. The organic solvent may include a hydrophilic (or water miscible) organic solvent. The organic solvent may include a hydrophobic organic solvent. The organic solvent may include a polar (organic) solvent. The organic solvent may include a non-polar (organic) solvent.

Types and amounts of the organic solvent may be selected appropriately taking into consideration the types and the amounts of the aforementioned main components (i.e., the quantum dot, the COOH group-containing binder, the photopolymerizable monomer, the crosslinker, the initiator, and if used, the thiol compound).

Non-limiting examples of the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; a glycol ether acetate such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; a (unsubstituted or substituted, for example, halogen or chloro substituted) aliphatic, alicyclic, or aromatic hydrocarbon or a carboxylate/ester derivative thereof (e.g., cyclohexyl acetate or the like); or a combination thereof.

Components included in the ink composition and concentrations thereof may be adjusted to control a viscosity of the ink composition, which is not particularly limited. A viscosity of the ink composition may be less than or equal to about 20 centipoise (cP), less than or equal to about 15 cP, less than or equal to about 10 cP, less than or equal to about 5 cP, less than or equal to about 4 cP, less than or equal to about 3 cP, less than or equal to about 2 cP, or less than or equal to about 1.5 cP. The viscosity of the ink composition may be greater than or equal to about 0.1 cP, greater than or equal to about 0.5 cP, or greater than or equal to about 0.8 cP.

The electroluminescent device that includes quantum dots of the embodiments may achieve an increased level of a EQE and an enhanced luminance. In an embodiment, the electroluminescent device may have an EQE that is greater than or equal to about 9%, greater than or equal to about 9.5%, greater than or equal to about 10%, greater than or equal to about 10.5%, greater than or equal to about 11%, or greater than or equal to about 11.5%. The EQE of the electroluminescent device may be less than or equal to about 30%, but is not limited thereto.

In an embodiment, the electroluminescent device may have a luminance of greater than or equal to about 10,000 $cd/m^2$, greater than or equal to about 11,000 $cd/m^2$, greater than or equal to about 12,000 $cd/m^2$, greater than or equal to about 13,000 $cd/m^2$, greater than or equal to about 14,000 $cd/m^2$, greater than or equal to about 15,000 $cd/m^2$, greater than or equal to about 20,000 $cd/m^2$, greater than or equal to about 25,000 $cd/m^2$, greater than or equal to about 30,000 $cd/m^2$, greater than or equal to about 35,000 $cd/m^2$, or greater than or equal to about 40,000 $cd/m^2$. The Luminance of the electroluminescent device may be less than or equal to about 500,000 $cd/m^2$, but is not limited thereto.

In an embodiment, the electroluminescent device may exhibit an extended lifetime. In an embodiment, T50 of the electroluminescent device may be greater than about 10 hours, greater than or equal to about 15 hours, greater than or equal to about 20 hours, greater than or equal to about 25 hours, or greater than or equal to about 30 hours.

In an embodiment, an electronic device includes the aforementioned quantum dots. The device may include a display device, a light emitting diode (LED), an organic light emitting diode (OLED), a quantum dot LED, a sensor, a solar cell, an image sensor, or a liquid crystal display (LCD), but is not limited thereto. In an embodiment, the electronic device may include a photoluminescent device (e.g., a quantum dot sheet or a lighting such as a quantum dot rail or a liquid crystal display (LCD)). In an embodiment, the electronic device may include a quantum dot sheet and the aforementioned quantum dots are dispersed in the sheet (e.g., in the form of a quantum dot polymer composite).

Hereinafter, the embodiments are illustrated in more detail with reference to examples. However, these examples are exemplary, and the present scope is not limited thereto.

EXAMPLES

Analysis Method
1. Ultraviolet-Visible (UV-Vis) Spectroscopic Analysis

Hitachi U-3310 spectrometer is used to perform an ultraviolet (UV) spectroscopic analysis and obtain UV-Visible absorption spectra.
2. Photoluminescence Analysis Photoluminescence (PL) spectra of the prepared nanocrystal are obtained using a Hitachi F-7000 spectrometer at an irradiation wavelength of 450 nanometers (nm).
3. TEM Analysis Transmission electron microscope (TEM) photographs of nanocrystals are obtained using an UT F30 Tecnai electron microscope.
4. X-Ray Diffraction (XRD) Analysis An XRD analysis is performed using a Philips XPert PRO equipment with a power of 3 kilowatts (kW).
5. Electroluminescence Spectroscopic Analysis A current depending on a voltage is measured using a Keithley 2635B source meter while applying a voltage and electroluminescent (EL) light emitting luminance is measured using a CS2000 spectrometer.

Synthesis is performed under an inert gas atmosphere (nitrogen flowing condition) unless particularly mentioned.
6. ICP Analysis An inductively coupled plasma-atomic emission spectroscopy (ICP-AES) analysis is performed using Shimadzu ICPS-8100.

Reference Example 1: InP Cores are Prepared in the Following Manner

Indium acetate and palmitic acid are dissolved in 1-octadecene in a 200 milliliters (mL) reaction flask, and heated under a vacuum state at 120° C. A molar ratio of indium to palmitic acid is 1:3. The atmosphere in the flask is exchanged with $N_2$. After the reaction flask is heated to 280° C., a mixed solution of tris(trimethylsilyl)phosphine ($TMS_3P$) and trioctyl phosphine (TOP) is quickly injected, and the reaction proceeds for 20 minutes. The reaction mixture then is rapidly cooled to room temperature and acetone is added thereto to produce nanocrystals, which are then separated by centrifugation and dispersed in toluene to obtain a toluene dispersion of the InP core nanocrystals. The amount of the TMS$_3$P is about 0.5 moles per one mole of indium. A size of the InP core thus obtained is about 3.3 nm.

Reference Example 2: Synthesis of Zn Metal Oxide Nanoparticles

Zinc acetate dihydrate and magnesium acetate tetrahydrate are added into a reactor including dimethyl sulfoxide to provide a molar ratio according to the following chemical formula and heated at 60° C. in an air atmosphere (mole ratio between zinc and magnesium=0.85:0.15). Subsequently, an ethanol solution of tetramethylammonium hydroxide pentahydrate is added into the reactor in a dropwise fashion at a speed of 3 milliliters (mL) per minute (mL/min). After stirring the same, the obtained zinc magnesium oxide (hereinafter, ZnMgO) nanoparticles are centrifuged and dispersed in ethanol.

The obtained nanoparticles are subjected to an X-ray diffraction analysis, so it is confirmed that they include a crystalline structure. The obtained nanoparticles are analyzed by a transmission electron microscopic analysis, and the results show that the particles have an average size of about 3 nm.

Example 1

Selenium and sulfur are dispersed in trioctyl phosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the flask is replaced with N$_2$. While the resulting solution is heated to about 180° C., a toluene dispersion of the InP semiconductor nanocrystal core is injected thereto.

A resulting mixture is heated to 280° C. and the Se/TOP stock solution is injected into the reaction flask and a reaction is carried out and then the reaction temperature is raised again to 320° C., and the Se/TOP stock solution is injected again to carry out the reaction, thereby forming a ZnSe shell on the InP core. Then, the S/TOP stock solution is added to the reaction system to carry out a reaction to form a ZnS shell on the ZnSe shell.

A total reaction time for forming the ZnSe shell is 60 minutes and a total amount of the selenium used with respect to one mole of the indium is about 20 moles. A total reaction time for forming the ZnS shell is 60 minutes and a total amount of the sulfur used with respect to one mole of the indium is about 10 moles.

An excess amount of ethanol is added to the final reaction mixture including the resulting InP/ZnSe/ZnS semiconductor nanocrystals, which is then centrifuged. After centrifugation, the supernatant is discarded and the precipitate is dried and dispersed in chloroform to obtain a quantum dot solution (hereinafter, QD solution).

Figure 4:
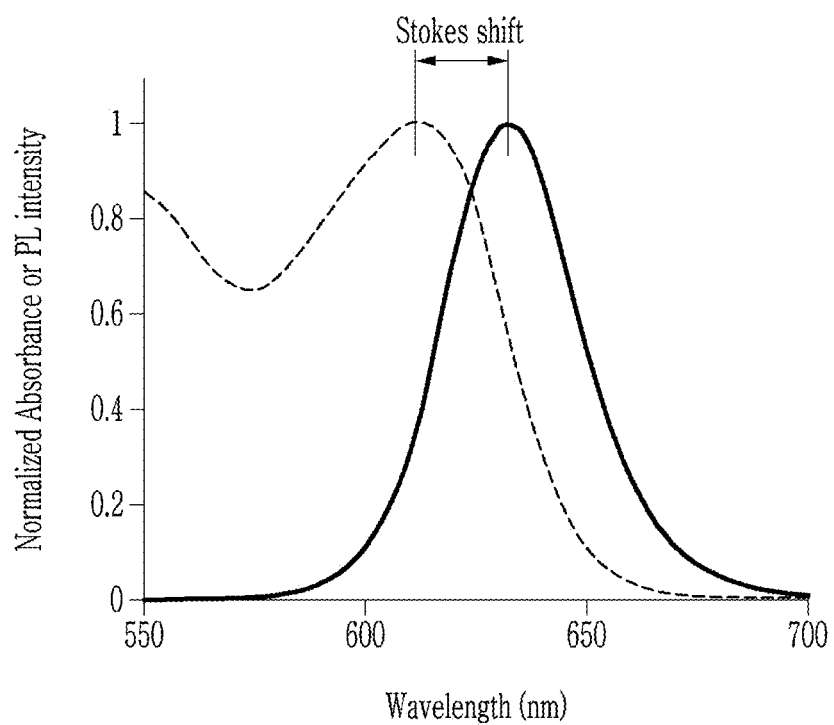
FIG. 4 is an ultraviolet-visible (UV-Vis) absorption spectrum (a dotted line) and a photoluminescence spectrum (a solid line) of the quantum dots prepared in Example 1.

(2) For the obtained QD solution, an ICP-AES analysis is made and the results are shown in Table 1. A UV-vis absorption spectroscopic analysis and a photoluminescence spectroscopic analysis are made for the QD solution, and the results are shown in FIG. 4 and Table 1. A TEM analysis is made for the QDs to obtain an average particle size thereof. The results are shown in Table 1, together.

Example 2

InP/ZnSe/ZnS quantum dots are prepared in the same manner as set forth in Example 1 except that the amounts of the Se precursor and the S precursor used are 25 moles and 15 moles with respect to one mole of the indium, respectively.

For the obtained QD solution, an ICP-AES analysis is made and the results are shown in Table 1. A UV-vis absorption spectroscopic analysis and a photoluminescence spectroscopic analysis are made for the QD solution, and the results are shown in Table 1. A TEM analysis is made for the QDs to obtain an average particle size thereof. The results are shown in Table 1, together.

Example 3

InP/ZnSe/ZnS quantum dots are prepared in the same manner as set forth in Example 1 except that the amounts of the Se precursor and the S precursor used are 30 moles and 20 moles with respect to one mole of the indium, respectively.

For the obtained QD solution, an ICP-AES analysis is made and the results are shown in Table 1. A UV-vis absorption spectroscopic analysis and a photoluminescence spectroscopic analysis are made for the QD solution, and the results are shown in Table 1. A TEM analysis is made for the QDs to obtain an average particle size thereof. The results are shown in Table 1, together.

Comparative Example 1

InP/ZnSe/ZnS quantum dots are prepared in the same manner as set forth in Example 1 except that the amount of the Se precursor used is 20 moles with respect to one mole of the indium and the temperature of forming the ZnSe shell is 320° C.

For the obtained QD solution, an ICP-AES analysis is made and the results are shown in Table 1. A UV-Vis absorption spectroscopic analysis and a photoluminescence spectroscopic analysis are made for the QD solution, and the results are shown in Table 1. A TEM analysis is made for the QDs to obtain an average particle size thereof. The results are shown in Table 1, together.

Comparative Example 2

InP/ZnSe/ZnS quantum dots are prepared in the same manner as set forth in Example 1 except that the amounts of the Se precursor and the S precursor used are 10 moles and 5 moles with respect to one mole of the indium, respectively, and the temperature of forming the ZnSe shell is 320° C.

For the obtained QD solution, an ICP-AES analysis is made and the results are shown in Table 1. A UV-Vis absorption spectroscopic analysis and a photoluminescence spectroscopic analysis are made for the QD solution, and the results are shown in Table 1. A TEM analysis is made for the QDs to obtain an average particle size thereof. The results are shown in Table 1, together.

TABLE 1

| | Stokes shift (nm) | average particle size (nm) | First UV absorption peak wavelength (nm) | PL peak wavelength (nm) | ICP-AES In:(Se + S) |
|---|---|---|---|---|---|
| Comparative Example 1 | 35 | 10 | 594 | 629 | 0.05:1 |
| Comparative Example 2 | 35 | 6 | 593 | 628 | 0.087:1 |
| Example 1 | 16 | 9 | 612 | 628 | 0.042:1 |
| Example 2 | 16 | 10 | 616 | 632 | 0.034:1 |
| Example 3 | 14 | 12 | 619 | 633 | 0.021:1 |

Stokes shift = PL wavelength (nm) − First UV absorption peak (nm)

Stokes shift=PL wavelength(nm)−First UV absorption peak(nm)

Example 4

An electroluminescent device having the structure of indium tin oxide (ITO)/poly(3,4-ethylenedioxythiophene) polystyrene sulfonate (PEDOT:PSS) (35 nm)/poly(9,9-dioctyl-fluorene-co-N-(4-butylphenyl)-diphenylamine) (TFB) (25 nm)/quantum dot emissive layer (20 nm)/ZnMgO (40 nm)/Al (100 nm) is prepared as below.

An ITO-deposited glass substrate is surface-treated with UV-ozone for 15 minutes and then spin-coated with a PEDOT:PSS solution (H. C. Starks) and heated at 150° C. for 10 minutes under an air atmosphere, and then heat-treated again at 150° C. for 10 minutes under an $N_2$ atmosphere to provide a hole injection layer having a thickness of 35 nm.

Subsequently, a poly[(9,9-dioctylfluorenyl-2,7-diyl-co(4,4'-(N-4-butylphenyl)diphenylamine] solution (TFB) (Sumitomo) is spin-coated on the hole injection layer and heat-treated at 150° C. for 30 minutes to form a hole transport layer.

The core/shell quantum dots obtained from Example 1 is spin-coated on the hole transport layer and heat-treated at 80° C. for 30 minutes to form a quantum dot emissive layer.

A solution of the ZnMgO nanoparticles according to Reference Example 2 (a solvent: ethanol, optical density: 0.5 a.u) is prepared. The solution is spin-coated on the second layer and heat-treated at 80° C. for 30 minutes to form an electron auxiliary layer. On the surface of the electron auxiliary layer, aluminum (Al) is vacuum-deposited to form a second electrode.

Figure 5:
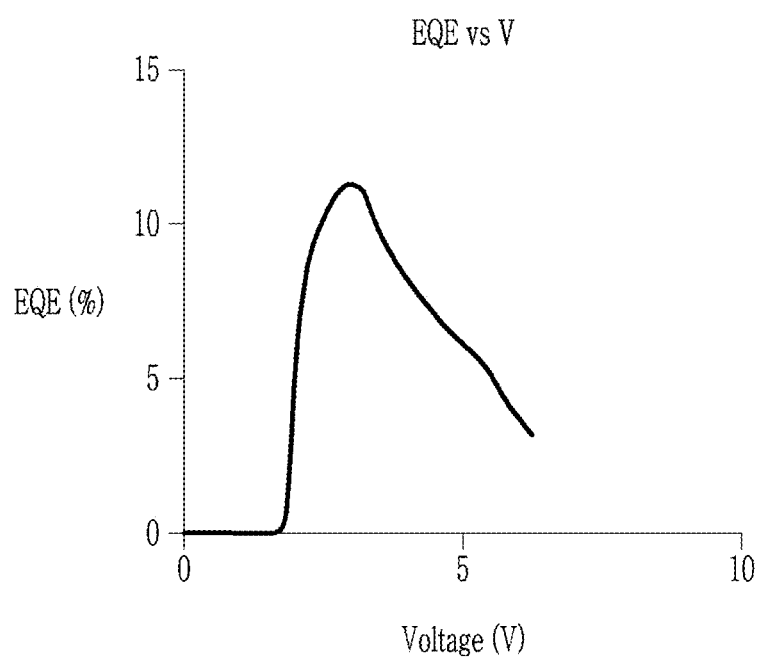
FIG. 5 is a graph of external quantum efficiency (EQE) (percent (%)) versus voltage (volts (V)) for the device prepared in Example 4.
Figure 6:
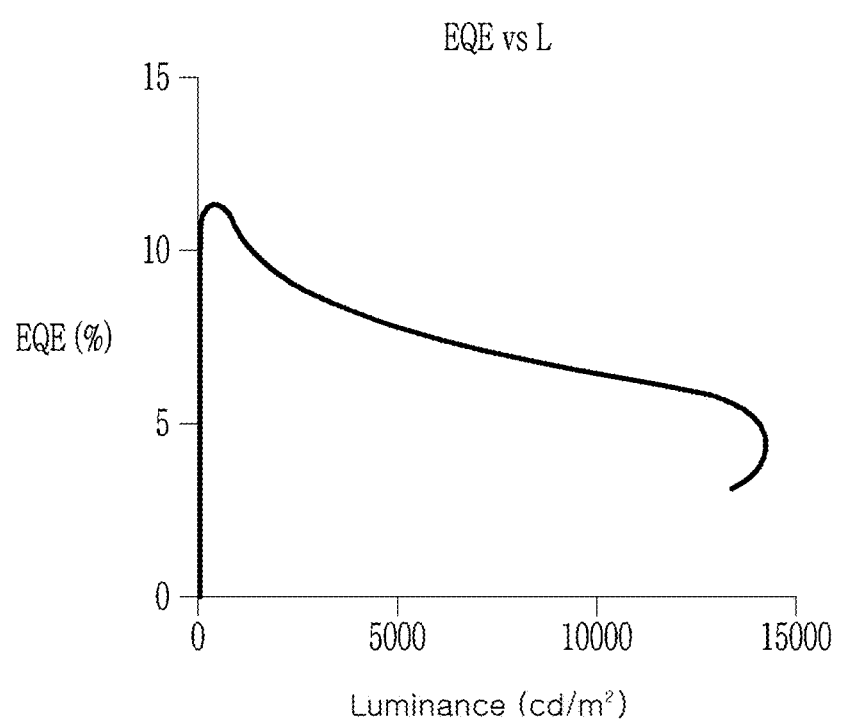
FIG. 6 is a graph of EQE (percent (%)) versus luminance (L) (candelas per square meter ($cd/m^2$)) for the device prepared in Example 4.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 2, and FIGS. 5 and 6.

Example 5

An electroluminescent device is manufactured in the same manner as set forth in Example 4, except for using the quantum dots of Example 2.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 2.

Comparative Example 3

An electroluminescent device is manufactured in the same manner as set forth in Example 4, except for using the quantum dots of Comparative Example 2.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 2.

Comparative Example 4

An electroluminescent device is manufactured in the same manner as set forth in Example 4, except that the quantum dots of Comparative Example 2 are used and a triaryltriazine compound is used to form an organic ETL instead of the zinc metal oxide particle.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 2

TABLE 2

| | Maximum external quantum efficiency (EQE) (%) | Maximum Luminance (candelas per square meter ($cd/m^2$)) | T50 (hours (h)) |
|---|---|---|---|
| Comparative Example 3 (Comparative Example 2 QD + ZnMgO ETL) | 4.0 | 8000 | 10 |
| Example 4 (Example 1 QD + ZnMgO ETL) | 11.9 | 15000 | 30 |
| Example 5 (Example 2 QD + ZnMgO ETL) | 10.0 | 18000 | 50 |
| Comparative Example 4 (Comparative Example 2 QD + organic ETL) | 1.6 | 950 | 0.3 |

T50 lifetime (h): at the operation of the device at 100 nits ($cd/m^2$), time taken for which the luminance of the device is reduced to 50% of its initial value (100%)

T50 lifetime (h): at the operation of the device at 100 nits ($cd/m^2$), time taken for which the luminance of the device is reduced to 50% of its initial value (100%)

The results of Table 2 confirm that the electroluminescent devices (including the quantum dots) of the Examples may exhibit improved electroluminescent properties and life time in comparison with the device of the Comparative Examples.

Example 6: (Example 1 QD+Organic ETL)

An electroluminescent device is manufactured in the same manner as set forth in Example 4, except that a triaryltriazine compound is used to form an organic ETL, instead of the zinc metal oxide particle.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results confirm that the device of Example 6 may exhibit enhanced EQE and luminance that are increased more than 3 times over and more than 6 times over, respectively, in comparison with the device of Comparative Example 4.

Example 7: (Example 2 QD+Organic ETL)

An electroluminescent device is manufactured in the same manner as set forth in Example 4, except that the quantum dots of Example 2 are used and a triaryltriazine compound is used to form an organic ETL, instead of the zinc metal oxide particle.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results confirm that the device of Example 7 may exhibit enhanced EQE and luminance that are increased more than 3 times over and more than 10 times over, respectively, in comparison with the device of Comparative Example 4.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting Device
11: first electrode
11a: anode
12, 20: hole auxiliary layer
13, 30: emissive layer
14, 40: electron auxiliary layer
15: second electrode
15a: cathode
100: transparent substrate

What is claimed is:

1. An electroluminescent device, comprising
a first electrode and a second electrode facing each other,
an emissive layer disposed between the first electrode and the second electrode, the emissive layer comprising quantum dots, and
wherein the quantum dots comprise
a semiconductor nanocrystal core comprising indium and phosphorous,
a first semiconductor nanocrystal shell disposed on the semiconductor nanocrystal core, the first semiconductor nanocrystal shell comprising zinc and selenium, and
a second semiconductor nanocrystal shell disposed on the first semiconductor nanocrystal shell, the second semiconductor nanocrystal shell comprising zinc and sulfur,
wherein the quantum dots do not comprise cadmium,
wherein the electroluminescent device has an external quantum efficiency of greater than or equal to about 9% and a maximum brightness of greater than or equal to about 10,000 candelas per square meter ($cd/m^2$).

2. The electroluminescent device of claim 1, wherein a wavelength of a maximum photoluminescent peak of the quantum dots is present in a range of greater than or equal to about 600 nanometers and less than or equal to about 650 nanometers.

3. The electroluminescent device of claim 1, wherein an average particle size of the quantum dots is greater than or equal to about 8 nanometers.

4. The electroluminescent device of claim 1, wherein an average particle size of the quantum dots is greater than or equal to about 9 nanometers.

5. The electroluminescent device of claim 1, wherein a quantum yield of the quantum dots is greater than or equal to about 60%.

6. The electroluminescent device of claim 1, wherein a particle size distribution of the quantum dots is less than or equal to about 20%.

7. The electroluminescent device of claim 1, wherein in the quantum dots, a molar ratio of indium to a sum of sulfur and selenium In:(Se+S) is greater than or equal to about 0.02:1 and less than or equal to about 0.1:1.

8. The electroluminescent device of claim 1, wherein in the quantum dots, a molar ratio of sulfur to selenium S:Se is greater than or equal to about 0.01:1 and less than or equal to about 4.5:1.

9. The electroluminescent device of claim 1, wherein the first semiconductor nanocrystal shell is disposed directly on a surface of the semiconductor nanocrystal core and the first semiconductor nanocrystal shell does not comprise sulfur.

10. The electroluminescent device of claim 9, wherein a thickness of the first semiconductor nanocrystal shell is greater than or equal to about 6 monolayers.

11. The electroluminescent device of claim 9, wherein the second semiconductor nanocrystal shell is an outermost layer of the quantum dots and the second semiconductor nanocrystal shell is disposed directly on a surface of the first semiconductor nanocrystal shell.

12. The electroluminescent device of claim 1, wherein a difference between a maximum photoluminescent peak wavelength and a first absorption peak wavelength of the quantum dots is less than or equal to about 16 nanometers.

13. The electroluminescent device of claim 1, wherein the electroluminescent device comprises an electron transport layer between the second electrode and the emissive layer.

14. The electroluminescent device of claim 13, wherein the electron transport layer comprises a metal oxide comprising zinc.

15. The electroluminescent device of claim 14, wherein the metal oxide comprises $Zn_{1-x}M_xO$, wherein M is Mg, Ca, Zr, W, Li, Ti, Y, Al, or a combination thereof and $0 \leq x \leq 0.5$.

16. Quantum dots comprising
a semiconductor nanocrystal core comprising indium and phosphorous, a first semiconductor nanocrystal shell disposed on the semiconductor nanocrystal core, the first semiconductor nanocrystal shell comprising zinc and selenium, and a second semiconductor nanocrystal shell disposed on the first semiconductor nanocrystal shell, the second semiconductor nanocrystal shell comprising zinc and sulfur, wherein the quantum dots do not comprise cadmium, and wherein a difference between a maximum photoluminescent peak wavelength and a first absorption peak wavelength of the quantum dots is less than or equal to about 20 nanometers.

17. The quantum dots of claim 16, wherein an average particle size of the quantum dots is greater than or equal to about 8 nanometers and a particle size distribution of the quantum dots is less than or equal to about 20% of the average particle size.

18. The quantum dots of claim 16, wherein in the quantum dots, a molar ratio of indium to a sum of sulfur and selenium In:(Se+S) is greater than or equal to about 0.02:1 and less than or equal to about 0.1:1.

19. The quantum dots of claim 16, wherein the first semiconductor nanocrystal shell is disposed directly on a surface of the semiconductor nanocrystal core and the first semiconductor nanocrystal shell does not comprise sulfur, and the second semiconductor nanocrystal shell is an outermost layer of the quantum dots.

20. The quantum dots of claim 19, wherein a thickness of the first semiconductor nanocrystal shell is greater than or equal to about 6 monolayers.

21. The quantum dots of claim 16, wherein the difference between a maximum photoluminescent peak wavelength and a first absorption peak wavelength of the quantum dots is less than or equal to about 17 nanometers.

22. The quantum dots of claim 16, wherein an average particle size of the quantum dots is greater than or equal to 8 nanometers and less than or equal to 50 nm.

* * * * *